US009257681B2

(12) United States Patent
Min (10) Patent No.: US 9,257,681 B2
(45) Date of Patent: Feb. 9, 2016

(54) ORGANIC ELECTROLUMINESCENT DISPLAY AND METHOD OF MANUFACTURING THE SAME

(71) Applicant: SAMSUNG DISPLAY CO., LTD., Yongin, Gyeonggi-Do (KR)

(72) Inventor: Kyoungwook Min, Suwon-si (KR)

(73) Assignee: Samsung Discplay Co., Ltd., Yongin-si (KR)

( * ) Notice: Subject to any disclaimer, the term of this patent is extended or adjusted under 35 U.S.C. 154(b) by 0 days.

(21) Appl. No.: 14/452,327

(22) Filed: Aug. 5, 2014

(65) Prior Publication Data

US 2015/0171379 A1    Jun. 18, 2015

(30) Foreign Application Priority Data

Dec. 16, 2013    (KR) .................. 10-2013-0156535

(51) Int. Cl.
*H01L 51/56* (2006.01)
*H01L 51/00* (2006.01)
*H01L 27/32* (2006.01)
*H01L 51/50* (2006.01)

(52) U.S. Cl.
CPC ............ *H01L 51/56* (2013.01); *H01L 27/3211* (2013.01); *H01L 51/0003* (2013.01); *H01L 51/5056* (2013.01); *H01L 51/5072* (2013.01); *H01L 51/5088* (2013.01); *H01L 51/5092* (2013.01)

(58) Field of Classification Search
None
See application file for complete search history.

(56) References Cited

U.S. PATENT DOCUMENTS 6,087,196 A * 7/2000 Sturm et al. ................. 438/29
2008/0111474 A1 * 5/2008 Sung et al. ................. 313/504

FOREIGN PATENT DOCUMENTS

| KR | 10-0479759 | 4/2005 |
| KR | 10-0663028 | 12/2006 |
| KR | 10-0921865 | 10/2009 |
| WO | WO 2012/001741 A1 | 1/2012 |

OTHER PUBLICATIONS

Korean Patent Abstracts Publication No. KR 10-2001-0013742 A, dated Feb. 26, 2001, for KR 10-0479759, 1 page.
Korean Patent Abstracts Publication No. KR 10-2005-0068819 A, dated Jul. 5, 2005, for KR 10-0663028, 1 page.
Korean Patent Abstracts Publication No. KR 10-2008-0086811 A, dated Sep. 26, 2008, for KR 10-0921865, 1 page.

* cited by examiner

*Primary Examiner* — Michelle Mandala
*Assistant Examiner* — Tyler Drye
(74) *Attorney, Agent, or Firm* — Christie, Parker & Hale, LLP (57) ABSTRACT

In a method of manufacturing an organic electroluminescent display, a substrate, in which a plurality of pixel areas is defined, is prepared, and first electrodes are formed in the pixel areas. Organic light emitting layers are formed on the first electrodes and a second electrode is formed on the organic light emitting layers. Resonant controllers are formed to control a resonant distance between each of the first electrodes and the second electrode. The resonant controllers are formed by providing solutions to at least two pixel areas, which emit lights having different colors, with a same amount in a one-to-one correspondence, and removing a solvent from the solutions. The solutions have different concentrations from each other.

17 Claims, 9 Drawing Sheets

ORGANIC ELECTROLUMINESCENT DISPLAY AND METHOD OF MANUFACTURING THE SAME

CROSS-REFERENCE TO RELATED APPLICATION

This patent application claims priority to and the benefit of Korean Patent Application No. 10-2013-0156535, filed on Dec. 16, 2013, in the Korean Intellectual Property Office, the content of which is hereby incorporated by reference in its entirety.

BACKGROUND

1. Field

The present disclosure relates to an organic electroluminescent display and a method of manufacturing the same.

2. Description of the Related Art

As one of the flat panel display devices, an organic electroluminescent display has been used to replace a liquid crystal display. The organic electroluminescent display is a self-emissive display device and displays an image, and thus the organic electroluminescent display does not need to include a separate light source, e.g., a backlight unit. Accordingly, the organic electroluminescent display has been spotlighted as a next generation display since it has the desired properties, e.g., fast response speed, low driving voltage, thin thickness, etc., when compared to the liquid crystal display device.

In general, the organic electroluminescent display includes an anode, a cathode, and an organic light emitting layer interposed between the anode and the cathode. Holes and electrons are injected into the organic light emitting layer through the anode and the cathode, and are recombined in the organic light emitting layer to generate excitons. The excitons emit energy, which is discharged as light, when returns from an excited state to a ground state.

SUMMARY

An aspect according to one or more embodiments of the present invention is directed toward an organic electroluminescent display having a resonant structure.

Another aspect according to one or more embodiments of the present invention is directed toward a method of manufacturing the organic electroluminescent display.

According to one or more embodiments of the inventive concept, a method of manufacturing an organic electroluminescent display includes preparing a substrate having a plurality of pixel areas defined thereon, the pixel areas including a first group of pixel areas for a first color of pixels, and at least a second group of pixel areas for at least a second color of pixels; forming a plurality of first electrodes in the pixel areas; forming a plurality of organic light emitting layers on the first electrodes; forming a plurality of resonant controllers on the first electrodes by: providing a first solution of a resonant source material in a solvent at a first concentration; providing at least a second solution of the resonant source material in the solvent at a second concentration; respectively applying the first and second solutions to the first and second groups of pixel areas, and removing the solvent from the solutions, thereby forming a plurality of resonant controllers, wherein the resonant controllers produced from the first solution have different thicknesses than the resonant controllers produced from the second solution; and forming a second electrode on the organic light emitting layers.

According to one or more embodiments of the inventive concept, an organic electroluminescent display includes a substrate having a plurality of pixel areas defined thereon; first electrodes in the pixel areas; organic light emitting layers on the first electrodes; a second electrode on the organic light emitting layers; and resonant controllers between the first electrodes and the second electrode to control a resonant distance. The resonant controllers are curved in a same direction.

According to the above, the flatness of the resonant controllers used to drive the pixels of the organic electroluminescent display in the resonant mode may be increased or maximized and controlled. Thus, open and short in circuits of the layers stacked on the resonant controllers may be reduced or prevented, which are due to the increase of the flatness of the layers stacked on the resonant controllers.

BRIEF DESCRIPTION OF THE DRAWINGS

The above and other enhancements of the present disclosure will become readily apparent by reference to the following detailed description when considered in conjunction with the accompanying drawings, wherein.

DETAILED DESCRIPTION

It will be understood that when an element or layer is referred to as being "on", "connected to" or "coupled to" another element or layer, it can be directly on, connected to or coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items. Further, the use of "may" when describing embodiments of the present invention refers to "one or more embodiments of the present invention."

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" or the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein should be interpreted accordingly.

The terminology used herein is for the purpose of describing particular embodiments only and is not intended to limit the scope of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in more detail with reference to the accompanying drawings.

Figure 1:
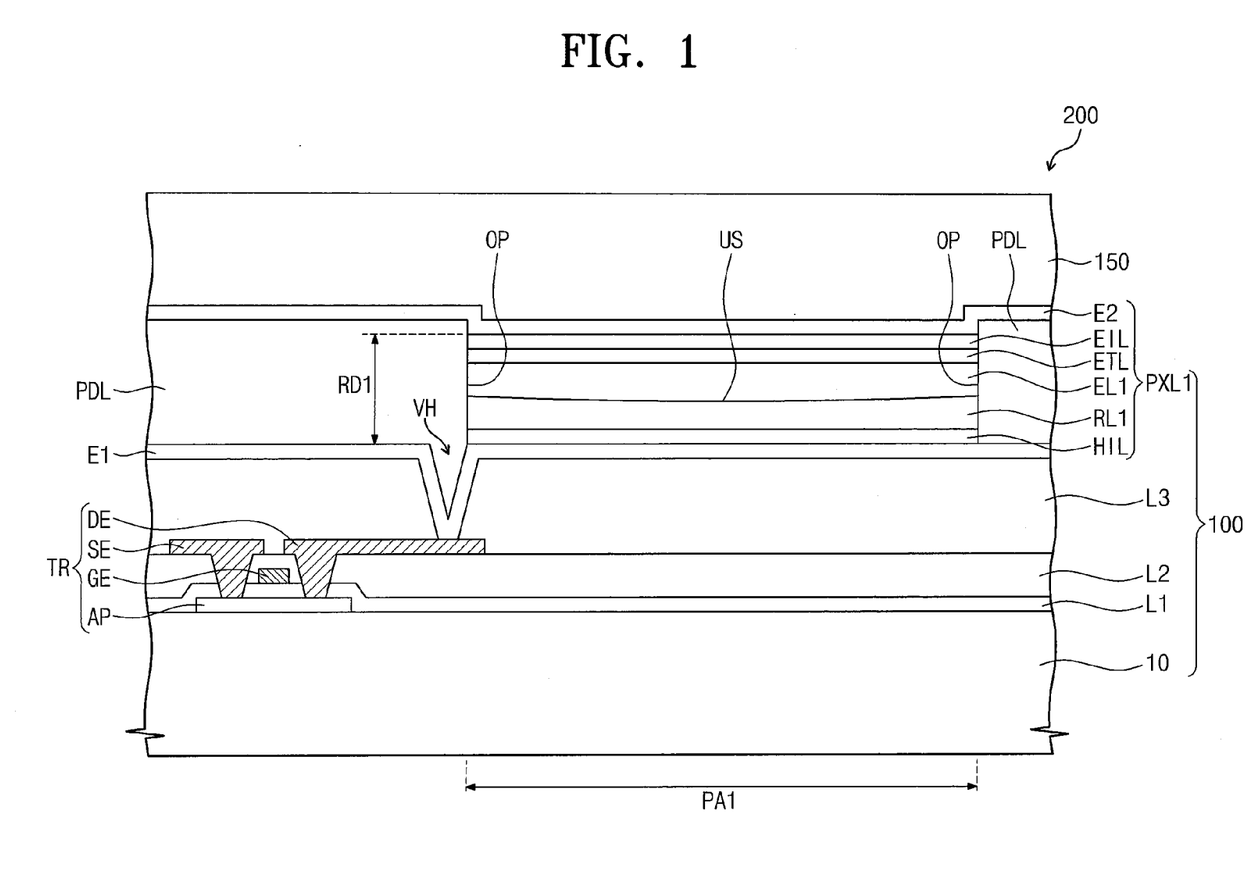
FIG. 1 is a cross-sectional view showing a first pixel of an organic electroluminescent display according to an example embodiment of the present disclosure.

FIG. 1 is a cross-sectional view showing a first pixel of an organic electroluminescent display according to an example embodiment of the present disclosure.

Referring to FIG. 1, an organic electroluminescent display 200 includes a display substrate 100 and a sealing part 150 to seal the display substrate 100. The display substrate 100 emits light to allow the organic electroluminescent display 200 to display an image. The sealing part 150 covers the display substrate 100 to block moisture and air from entering the display substrate 100. In the present example embodiment, the sealing part 150 includes a plurality of inorganic layers and a plurality of organic layers alternately stacked with the inorganic layers and has flexibility.

The display substrate 100 includes a substrate 10, a driving transistor TR, a pixel definition layer PDL, and a first pixel PXL1. The first pixel PXL 1 includes a first electrode E1, a hole injection layer HIL, a first resonant controller RL1, a first organic light emitting layer EL1, an electron transfer layer ETL, and an electron injection layer EIL.

The driving transistor TR is electrically connected to the first electrode E1 to switch on or switch off a power signal applied to the first electrode E1. The driving transistor TR includes a gate electrode GE, an active pattern AP, a source electrode SE, and a drain electrode DE. The source electrode SE is electrically connected to a power line that transfers the power signal, and the drain electrode DE is electrically connected to the first electrode E1. Accordingly, when the driving transistor TR is turned on in response to a gate signal applied to the gate electrode GE, the power signal is applied to the first electrode E1 through the driving transistor TR.

In the present example embodiment, the active pattern AP includes a semiconductor material, such as amorphous silicon, crystalline silicon, etc., but it should not be limited thereto or thereby. The active pattern AP may include an oxide semiconductor, e.g., indium gallium zinc oxide (IGZO), ZnO, $SnO_2$, $In_2O_3$, $Zn_2SnO_4$, $Ge_2O_3$, $HfO_2$, etc., or a compound semiconductor, e.g., GaAs, GaP, InP, etc.

A gate insulating layer L1 covers the active pattern AP to insulate the gate electrode GE from the active pattern AP, and an inter-insulating layer L2 covers the gate electrode GE to insulate the source and drain electrodes SE and DE from the gate electrode GE. In addition, a planarization layer L3 covers the driving transistor TR and includes a via hole VH formed therethrough, and thus the first electrode E1 is electrically connected to the drain electrode DE through the via hole VH.

The pixel definition layer PDL is disposed on the first electrode E1. The pixel definition layer PDL includes an opening OP formed therethrough to correspond to a first pixel area PA1, so that the first electrode E1 makes contact with the hole injection layer HIL through the opening OP.

The first pixel PXL1 has the following structure. The first electrode E1 is disposed on the planarization layer L3 to correspond to the first pixel area PA1. When the organic electroluminescent display is a front surface light emitting display, the first electrode E1 includes a metal material, e.g., aluminum, to have a light reflective property. In addition, when the organic electroluminescent display is a rear surface light emitting display, the first electrode E1 includes a conductive (transparent conductive) material, e.g., indium tin oxide, to have a light transmissive property, or includes a transparent conductive layer and a metal layer disposed on the transparent conductive layer to have a transflective property.

The hole injection layer HIL, the first resonant controller RL1, the first organic light emitting layer EL1, the electron transfer layer ETL, the electron injection layer EIL, and the second electrode E2 are sequentially stacked on the first electrode E1. When the first electrode E1 serves as an anode and the second electrode E2 serves as a cathode, holes injected through the first electrode E1 are provided to the first organic light emitting layer EL1 through the hole injection layer HIL and the resonant controller RL1, and electrons injected through the second electrode E2 are provided to the first organic light emitting layer EL1 through the electron injection layer EIL and the electron transfer layer ETL. Accordingly, light is emitted from the first organic light emitting layer EL1 by energy generated due to the recombination of the holes and the electrons in the first organic light emitting layer EL1.

In the present example embodiment, the first resonant controller RL1 is disposed in the first pixel area PA1 to overlap with the first organic light emitting layer EL1. The first resonant controller RL1 may include a hole transfer layer HTL (refer to FIG. 3) interposed between the first organic light emitting layer EL1 and the hole injection layer HIL, or may include another layer disposed between the first organic light emitting layer EL1 and the hole injection layer HIL instead of the hole transfer layer.

Figure 2:
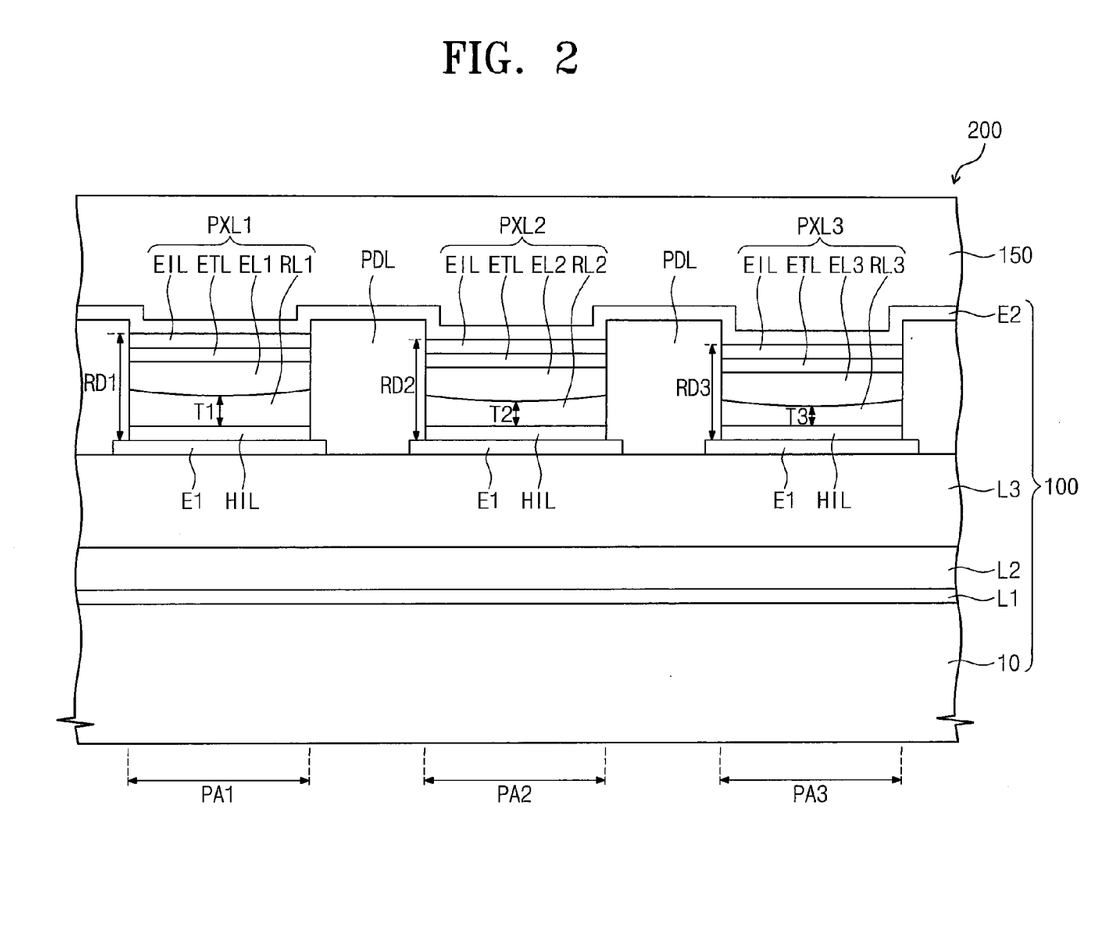
FIG. 2 is a cross-sectional view showing a first, second, and third pixels of the organic electroluminescent display shown in FIG. 1.

In the present example embodiment, the first organic light emitting layer EL1 emits a red light, and thus the first pixel PXL1 emits the red light. In this case, a first resonant distance RD1 of the first pixel PXL1 may be controlled by a first thickness T1 of the first resonant controller RL1 (as shown in FIG. 2).

The first resonant distance RD1 corresponds to a distance between the first and second electrodes E1 and E2. When the first resonant distance RD1 is set to be an integer times of a value obtained by dividing a wavelength of the red light by "2", the red light emitted from the first organic light emitting layer EL1 may have a constructive interference. As a result, the first pixel PXL1 is driven in a resonant mode and the intensity of the red light emitted from the first pixel PXL1 is increased.

The first resonant controller RL1 may have (e.g., has) a concave shape on an upper surface thereof. This is because of the manufacturing method of the first resonant controller RL1 and will be described in more detail later.

The second electrode E2 is disposed on the electron injection layer EIL. When the organic electroluminescent display 200 is the rear surface light emitting display, the second electrode E2 includes a metal material, e.g., aluminum, to have a light reflective property. In addition, when the organic electroluminescent display 200 is a front surface light emitting display, the second electrode E2 includes a conductive material, e.g., indium tin oxide, to have a light transmissive property, or includes a transparent conductive layer and a metal layer disposed on the transparent conductive layer to have a transflective property.

FIG. 2 is a cross-sectional view showing a first, second, and third pixels of the organic electroluminescent display shown in FIG. 1. In FIG. 2, the same reference numerals denote the same elements as in FIG. 1, and thus detailed descriptions of the same elements will be omitted.

Referring to FIG. 2, the display substrate 100 of the organic electroluminescent display 200 includes a first, second, and third pixels PXL1, PXL2, and PXL3. The first pixel PXL1 is disposed in the first pixel area PA1, the second pixel PXL2 is disposed in the second pixel area PA2, and the third pixel PXL3 is disposed in the third pixel area PA3.

In the present example embodiment, the first, second, and third pixels PXL1, PXL2, and PXL3 emit lights having different colors. In more detail, the first pixel PXL1 emits a red light, the second pixel PXL2 emits a green light, and the third pixel PXL3 emits a blue light.

As the first pixel PXL1 described with reference to FIG. 1, each of the second and third pixels PXL2 and PXL3 includes a first electrode E1, a hole injection layer HIL, an electron transport layer ETL, and an electron injection layer EIL. In addition, the second pixel PXL2 includes a second organic light emitting layer EL2 and a second resonant controller RL2 overlapped with the second organic light emitting layer EL2, and the third pixel PXL3 includes a third organic light emitting layer EL3 and a third resonant controller RL3 overlapped with the third organic light emitting layer EL3.

In the present example embodiment, the second organic light emitting layer EL2 emits the green light and the third organic light emitting layer EL3 emits the blue light. In addition, as the first resonant controller RL1 described with reference to FIG. 1, each of the second and third resonant controllers RL2 and RL3 includes the hole transport layer HTL (refer to FIG. 3) or another layer that replaces the hole transport layer.

Each of the hole injection layer HIL, the electron transport layer ETL, and the electron injection layer EIL is formed in each of the first, second, and third areas PA1, PA2, and PA3 through a patterning process, but it should not be limited thereto or thereby. For instance, according to embodiments, at least one of the hole injection layer HIL, the electron transport layer ETL, and the electron injection layer EIL may be formed to have a single-layer structure over the first, second, and third pixel areas PA1, PA2, and PA3.

A second resonant distance RD2 is set to be an integer times of a value obtained by dividing the wavelength of the green light by two ("2"). Therefore, the second resonant distance RD2 may be easily controlled by controlling a second thickness T2 of the second resonant controller RL2 in the second pixel PXL2. That is, the second resonant controller RL2 is provided to the second pixel PXL2 and the second thickness T2 of the second resonant controller RL2 is controlled such that the second pixel PXL2 is driven in the resonant mode.

A third resonant distance RD3 is set to be an integer times of a value obtained by dividing a wavelength of the blue light by two ("2"). Therefore, the third resonant distance RD3 may be easily controlled by controlling a third thickness T3 of the third resonant controller RL3 in the third pixel PXL3. That is, the third resonant controller RL3 is provided to the third pixel PXL3 and the third thickness T3 of the third resonant controller RL3 is controlled such that the third pixel PXL3 is driven in the resonant mode.

Meanwhile, since the wavelength of the red light, the wavelength of the green light, and the wavelength of the blue light are different from each other, the first, second, and third resonant distances RD1, RD2, and RD3 are different from each other. In more detail, the wavelength of the red light is greater than the wavelength of the green light, and the wavelength of the green light is greater than the wavelength of the blue light, and thus, among the first, second, and third resonant distances RD1, RD2, and RD3, the first resonant distance RD1 is the largest and the third resonant distance RD3 is the smallest. Thus, the first thickness T1 is greater than the second thickness T2, and the third thickness T3 is smaller than the second thickness T2.

In the present example embodiment, each of the second and third resonant controllers RL2 and RL3 has a concave shape on an upper surface thereof, the same as the first resonant controller RL1. In addition, the upper surfaces of the first, second, and third resonant controllers RL1, RL2, and RL3 have substantially the same curvature. This will be described in more detail with reference to FIGS. 5A to 5E.

Figure 3:
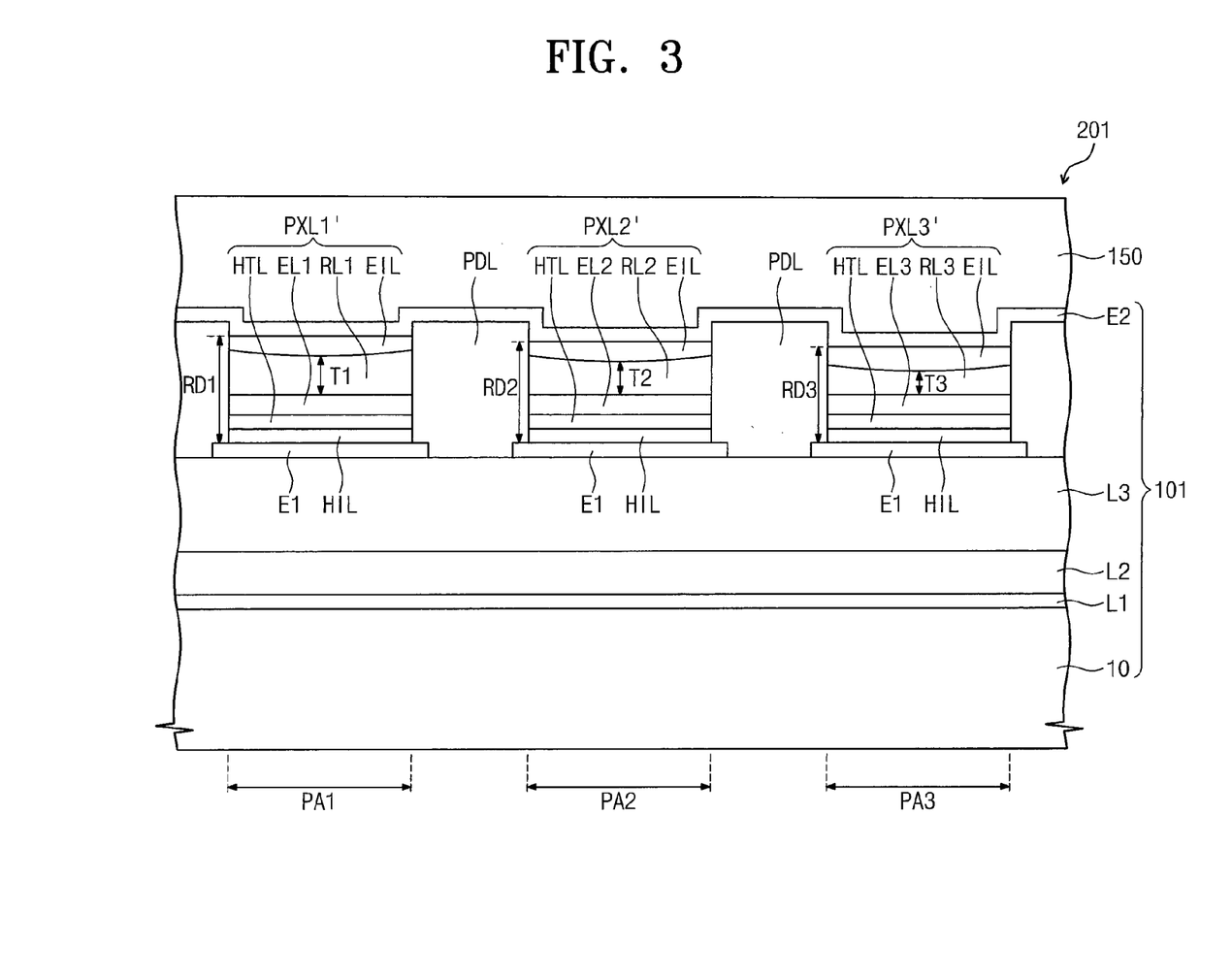
FIG. 3 is a cross-sectional view showing a first, second, and third pixels of an organic electroluminescent display according to another example embodiment of the present disclosure.

FIG. 3 is a cross-sectional view showing a first, second, and third pixels of an organic electroluminescent display according to another example embodiment of the present disclosure. In FIG. 3, the same reference numerals denote the same elements in FIGS. 1 and 2, and thus detailed descriptions of the same elements will be omitted.

Referring to FIG. 3, an organic electroluminescent display 201 includes a display substrate 101 and a sealing part 150, and the display substrate 101 includes a first pixel PXL1', a second pixel PXL2', and a third pixel PXL3'. In the present example embodiment, the first pixel PXL1' includes a first organic light emitting layer EL1 to emit the red light, the second pixel PXL2' includes a second organic light emitting layer EL2 to emit the green light, and the third pixel PXL3' includes a third organic light emitting layer EL3 to emit the blue light.

Each of the first, second, and third pixels PXL1', PXL2', and PXL3' includes a first electrode E1, a hole injection layer HIL, a hole transport layer HTL, and an electron injection layer EIL. In addition, the first pixel PXL1' includes a first resonant controller RL1 disposed between the first organic light emitting layer EL1 and the electron injection layer EIL, the second pixel PXL2' includes a second resonant controller RL2 disposed between the second organic light emitting layer EL2 and the electron injection layer EIL, and the third pixel PXL3' includes a third resonant controller RL3 disposed between the third organic light emitting layer EL3 and the electron injection layer EIL.

Different from the example embodiment described with reference to FIG. 2, the hole transport layer HTL is disposed on and makes contact with the hole injection layer HIL in each of the first, second, and third pixels PXL1', PXL2', and PXL3', and the first, second, and third resonant controllers RL1, RL2, and RL3 are respectively disposed in the first, second, and third pixels PXL1', PXL2', and PXL3' instead of (or in place of) the electron transport layers ETL (refer to FIG. 2). That is, the first, second, and third resonant controller RL1, RL2, and RL3 include the electron transport layers, or the electron transport layers are replaced with the first, second, and third resonant controllers RL1, RL2, and RL3.

As the example embodiment described with reference to FIG. 2, since the first resonant controller RL1 is disposed in the first pixel PXL1', the first resonant distance RD1 may be easily controlled by controlling the thickness of the first resonant controller RL1. In addition, the second resonant distance RD2 may be easily controlled by controlling the thickness of the second resonant controller RL2, and the third resonant distance RD3 may be trolled by controlling the thickness of the third resonant controller RL3.

Figure 4:
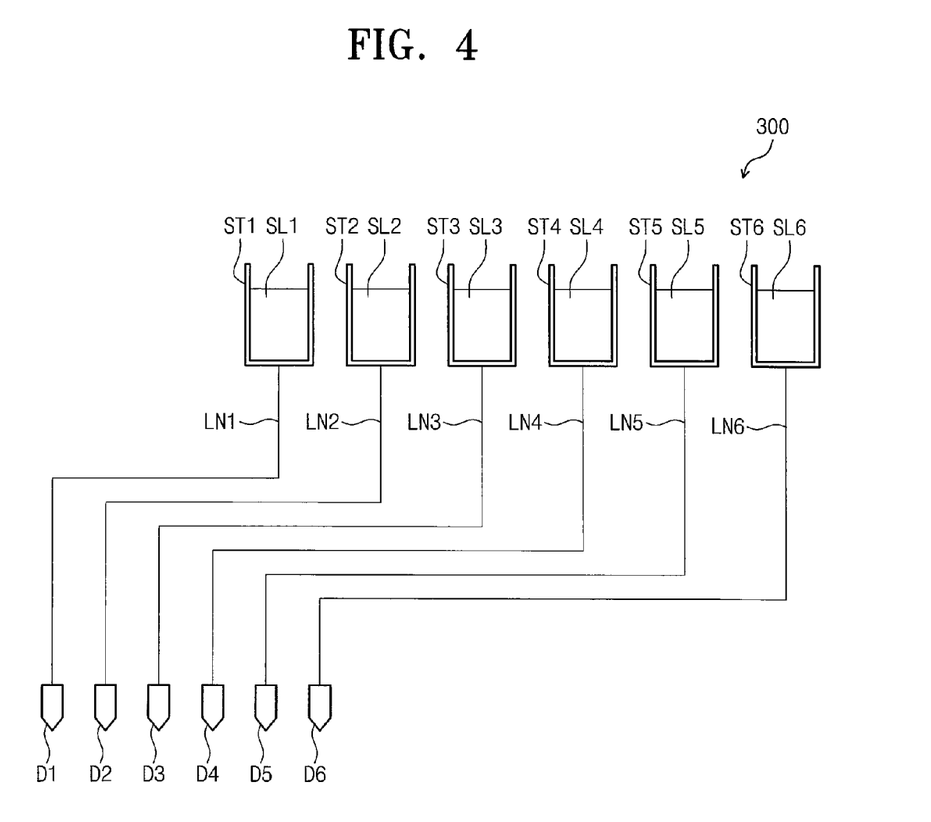
FIG. 4 is a schematic view showing a solution supply unit used (utilized) to form organic light emitting layers and resonant controllers shown in FIG. 2.

FIG. 4 is a schematic view showing a solution supply unit 300 used to form the organic light emitting layers and resonant controllers shown in FIG. 2.

Referring to FIG. 4, the solution supply unit 300 includes a first, second, third, fourth, fifth, and sixth tanks ST1, ST2, ST3, ST4, ST5, and ST6; a first, second, third, fourth, fifth, and sixth lines LN1, LN2, LN3, LN4, LN5, and LN6; and a first, second, third, fourth, fifth, and sixth spray units D1, D2, D3, D4, D5, and D6.

The first to sixth solutions SL1 to SL6 are accommodated in the first to sixth tanks ST1 to ST6, respectively. In addition, one end of each of the first to sixth lines LN1 to LN6 is connected to one of the first to sixth tanks ST1 to ST6 in a one-to-one correspondence, and the other end of each of the first to sixth lines LN1 to LN6 is connected to one of the first to sixth spray units D1 to D6 in a one-to-one correspondence.

Accordingly, the first to sixth solutions SL1 to SL6 are provided to the first to sixth spray units D1 to D6 through the first to sixth lines LN1 to LN6, and sprayed through the first to sixth spray units D1 to D6.

The first solution SL1 is a source material used (utilized) to form the first resonant controller RL1 (refer to FIG. 2), the second solution SL2 is a source material used to form the second resonant controller RL2 (refer to FIG. 2), and the third solution SL3 is a source material used to form the third resonant controller RL3 (refer to FIG. 2). In the present example embodiment, the first, second, and third solutions SL1, SL2, and SL3 are formed by dissolving a solute in a solvent, and the solutes dissolved in the solvent have different concentrations in the first, second, and third solutions SL1, SL2, and SL3.

In the present example embodiment, the solvent and solute may include the same materials as the solvent and solute of a conventional source solution used to form the hole transport layer HTL (refer to FIG. 3) using (utilizing) a printing method. However, the solvent and solute should not be limited thereto or thereby.

The fourth solution SL4 is a source material used to form the first organic light emitting layer EL1 (refer to FIG. 2), the fifth solution SL5 is a source material used to form the second organic light emitting layer EL2 (refer to FIG. 2), and the sixth solution SL6 is a source material used to form the third organic light emitting layer EL3 (refer to FIG. 2). As described above, since the first to third organic light emitting layers emit lights having different colors, the solutes dissolved in the fourth, fifth, and sixth solutions SL4, SL5, and SL6 are different from each other.

Hereinafter, a method of forming the first, second, and third resonant controllers RL1, RL2, and RL3 (refer to FIG. 2) of the organic electroluminescent display will be described with reference to FIGS. 5A to 5E.

FIGS. 5A to 5E are views showing a method of manufacturing the organic electroluminescent display shown in FIG. 2.

Figure 5A:
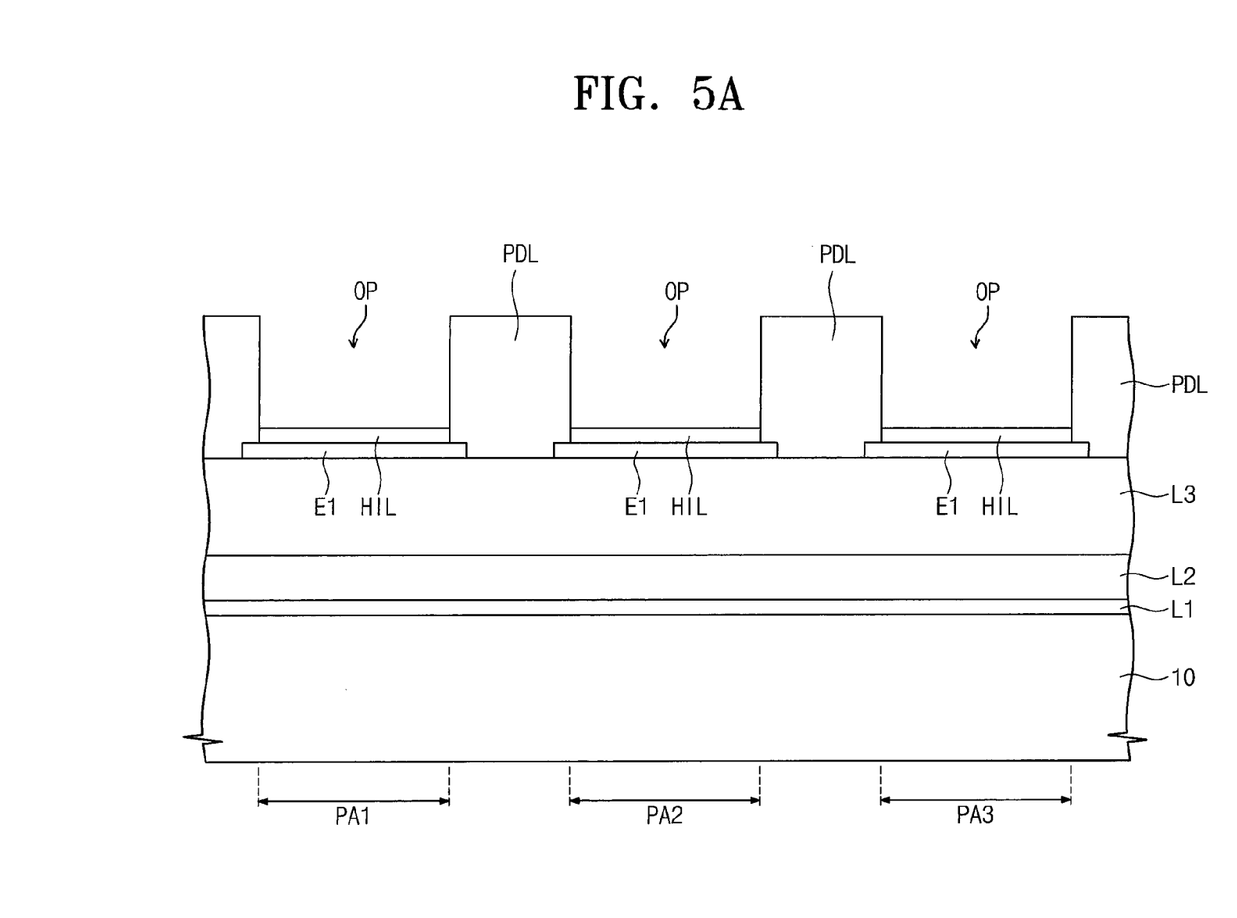
FIGS. 5A to 5E are views showing a method of manufacturing the organic electroluminescent display shown in FIG. 2.

Referring to FIG. 5A, a substrate 10, in which the first, second, and third pixel areas PA1, PA2, and PA3 are defined, is prepared. The gate insulating layer L1, the inter-insulating layer L2, and the planarization layer L3 are formed on the substrate 10. Although not shown in FIG. 5A, the transistor TR1 is formed in each of the first, second, and third pixel areas PA1, PA2, and PA3 before the planarization layer L3 is formed.

Then, the first electrode E1 is formed in each of the first, second, and third pixel areas PA1, PA2, and PA3, and the pixel definition layer PDL is formed. The pixel definition layer PDL includes openings OP formed therethrough to correspond to the first, second, and third pixel areas PA1, PA2, and PA3, respectively.

After the pixel definition layer PDL is formed, the hole injection layer HIL is formed on the first electrode E1 exposed through the opening OP. In the present example embodiment, the hole injection layer HIL is formed by an inkjet method, but it should not be limited thereto or thereby. That is, the hole injection layer HIL may be formed using a spin coating method, and in this case, the hole injection layer HIL may be formed in a single-layer structure over the first, second, and third pixel areas PA1, PA2, and PA3.

Figure 5B:
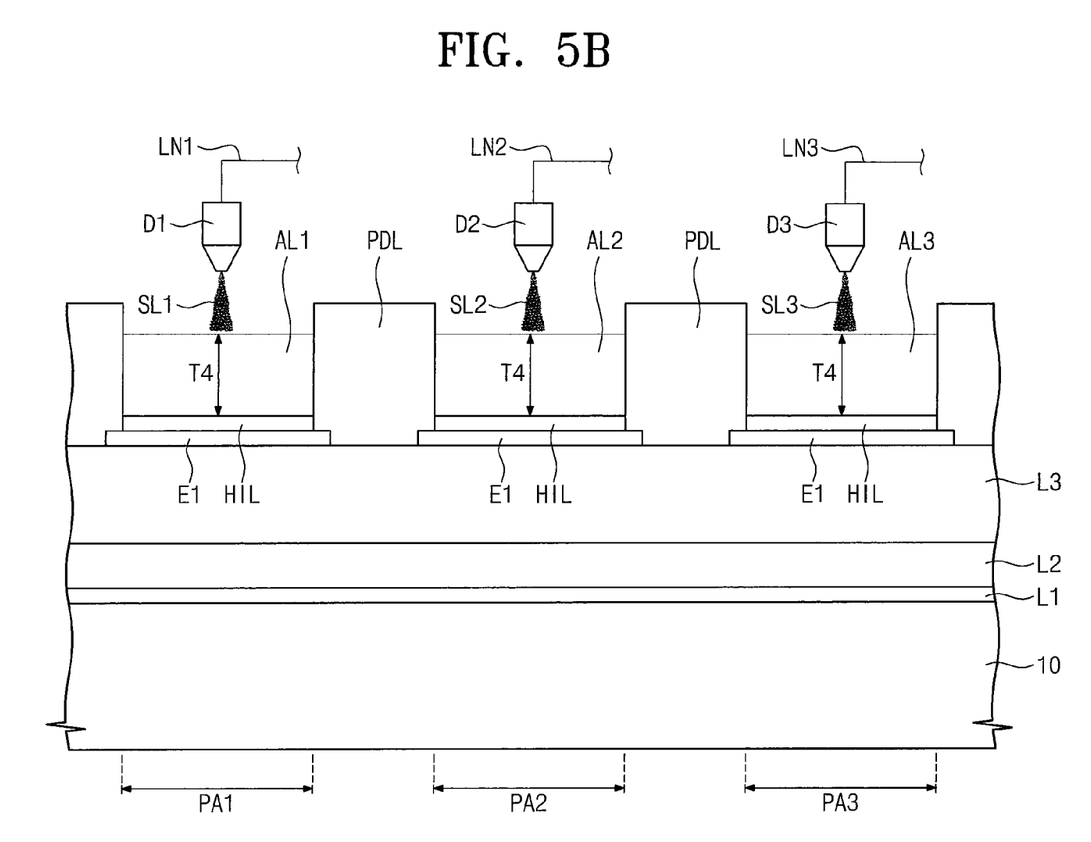

Referring to FIGS. 4 and 5B, a first preliminary resonant controller AL1 is formed in the first pixel area PA1, a second preliminary resonant controller AL2 is formed in the second pixel area PA2, and a third preliminary resonant controller AL3 is formed in the third pixel area PA3.

The first, second, and third preliminary resonant controllers AL1, AL2, and AL3 are formed by the following method. The first, second, and third spray units D1, D2, and D3 are prepared. The first spray unit D1 is connected to the first tank ST1 through the first line LN1, the second spray unit D2 is connected to the second tank ST2 through the second line LN2, and the third spray unit D3 is connected to the third tank ST3 through the third line LN3.

The first spray unit D1 sprays the first solution SL1 to the first pixel area PA1 to form the first preliminary resonant controller AL1, the second spray unit D2 sprays the second solution SL2 to the second pixel area PA2 to form the second preliminary resonant controller AL2, and the third spray unit D3 sprays the third solution SL3 to the third pixel area PA3 to form the third preliminary resonant controller AL3.

In the present example embodiment, the first, second, and third solutions SL1, SL2, and SL3 are provided to the first, second, and third pixel areas PA1, PA2, and PA3 in the same amount. As a result, the first, second, and third preliminary resonant controllers AL1, AL2, and AL3 have substantially the same thickness. For instance, when the first preliminary resonant controller AL1 has a fourth thickness T4, each of the second and third preliminary resonant controllers AL2 and AL3 has the fourth thickness T4.

In the present example embodiment, the fourth thickness T4 is greater than each of the first, second, and third thicknesses T1, T2, and T3 (refer to FIG. 2). This is because the solvent of the first solution SL1 used to form the first preliminary resonant controller AL1, the solvent of the second solution SL2 used to form the second preliminary resonant controller AL2, and the solvent of the third solution SL3 used to form the third preliminary resonant controller AL3 are removed while a drying process is performed on the first, second, and third preliminary resonant controllers AL1, AL2, and AL3.

Figure 5C:
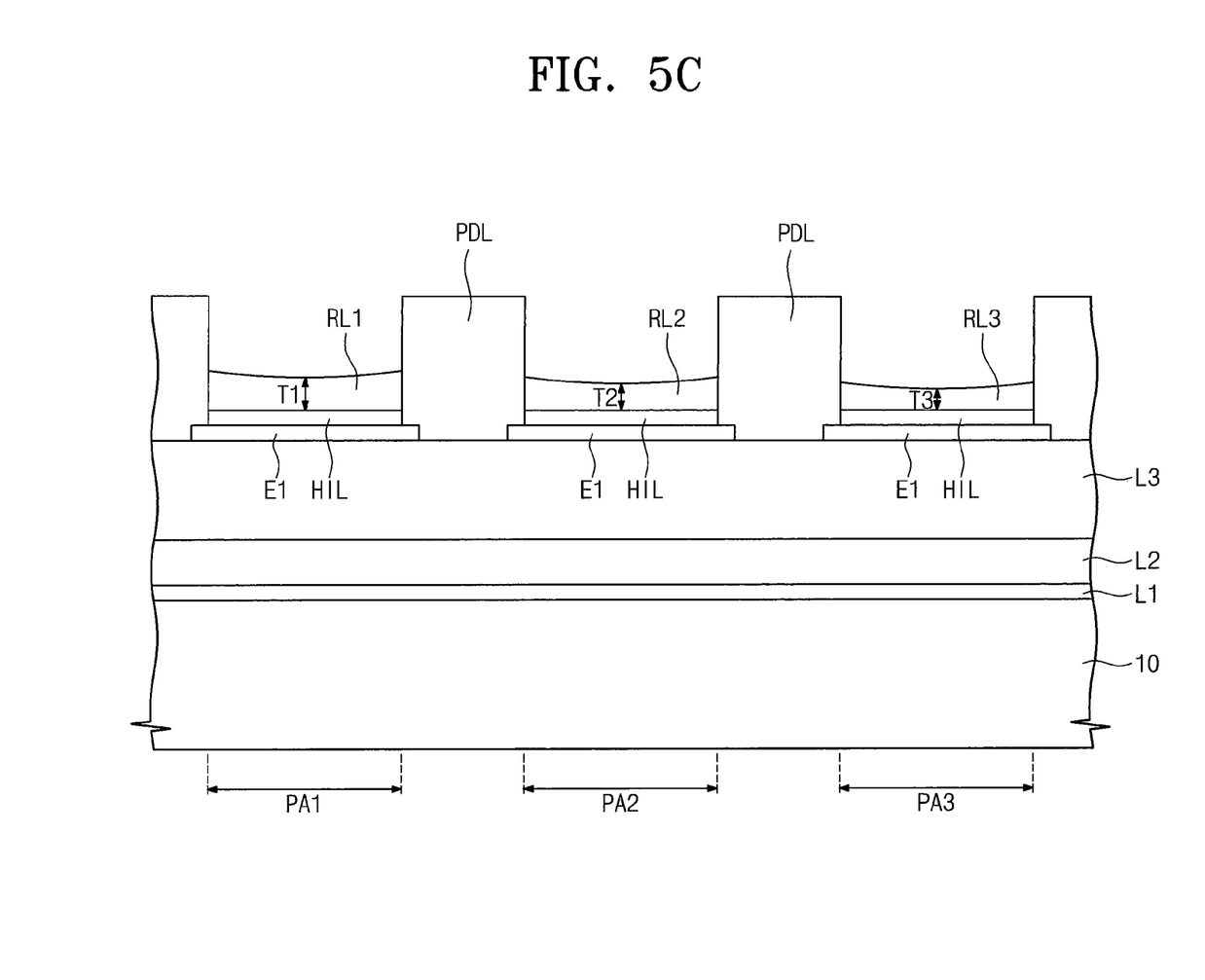

Referring to FIGS. 5B and 5C, the drying process is performed on the first, second, and third preliminary resonant controllers AL1, AL2, and AL3 to form the first, second, and third resonant controller RL1, RL2, and RL3. In addition, the drying process is performed on the first, second, and third preliminary resonant controllers AL1, AL2, and AL3 under the same condition. For instance, the first, second, and third preliminary resonant controllers AL1, AL2, and AL3 are substantially simultaneously or concurrently dried during the same time period at room temperature, or are substantially simultaneously or concurrently dried during the same time period at a set or predetermined temperature.

As described with reference to FIG. 4, the first, second, and third solutions SL1, SL2, and SL3 used to form the first, second, and third preliminary resonant controllers AL1, AL2, and AL3 are formed by dissolving the solutes in the solvents, but the solutes dissolved in the solvents have different concentrations in the first, second, and third solutions SL1, SL2, and SL3. Therefore, during the drying process, an amount of the solvent removed from the first preliminary resonant controller AL1 is smaller than an amount of the solvent removed from the second preliminary resonant controller AL2, and the amount of the solvent removed from the second preliminary resonant controller AL2 is smaller than an amount of the solvent removed from the third preliminary resonant controller AL3. However, when the drying process is performed, an amount of the solute that remains in the first pixel area PA1 is greater than an amount of the solute that remains in the second pixel area PA2, and the amount of the solute that remains in the second pixel area PA2 is greater than an amount of the solute that remains in the third pixel area PA3. As a result, the thickness T1 of the first resonant controller RL1 is greater than the second thickness T2 of the second resonant controller RL2, and the thickness T2 of the second resonant controller RL2 is greater than the thickness T3 of the third resonant controller RL3.

In the present example embodiment, each of the first, second, and third resonant controllers RL1, RL2, and RL3, which is formed by the drying process, has the concave shape on the upper surface thereof due to the following reason.

In the first preliminary resonant controller AL1 formed by the first solution SL1, an evaporation speed of the solvent in edge portions of the upper surface of the first preliminary resonant controller AL1 is faster than an evaporation speed of the solvent in the center portion of the upper surface of the first preliminary resonant controller AL1 while the drying process is performed on the first preliminary resonant controller AL1. As a result, during the evaporation of the solvent, the solute in the upper surface reflows from the center portion of the upper surface to the edge portions of the upper surface, and thus a coffee ring phenomenon, in which the solute is aggregated on the edge portions of the first preliminary resonant controller by the reflow, occurs. Thus, after the drying process is finished, the height of the edge portions may be greater than the height of the center portion, so that the upper surface of the first resonant controller RL1 has the concave shape.

Meanwhile, as the flatness of the upper surface of each of the first, second, and third resonant controllers RL1, RL2, and RL3 becomes large (i.e., as the upper surface of each of the first, second, and third resonant controllers RL1, RL2, and RL3 becomes more flat), a surface flatness of thin film layers stacked on the first, second, and third resonant controllers RL1, RL2, and RL3 may become large (i.e., the surface of thin film layers stacked on the first, second, and third resonant controllers RL1, RL2, and RL3 may become more flat). Accordingly, the thin film layers may have the large-surface flatness, and open or short in circuits may be reduced or prevented. However, since the coffee ring phenomenon occurs while the drying process is performed, the upper surfaces of the first, second, and third resonant controllers RL1, RL2, and RL3 may have the concave shape slightly. Therefore, the curvature of each upper surface of the first, second, and third resonant controllers RL1, RL2, and RL3 is required to be reduced or minimized in order to improve the flatness of the upper surfaces of the first, second, and third resonant controllers RL1, RL2, and RL3.

In more detail, as described above, although the amount of the solvents contained in the first, second, and third solutions SL1, SL2, and SL3 is slightly different from each other due to the difference in concentration of the first, second, and third solutions SL1, SL2, and SL3, the first, second, and third preliminary resonant controllers AL1, AL2, and AL3 are formed to have the same thickness. Accordingly, during the drying process, the difference in the amount of the solvent evaporated from the first, second, and third solutions SL1, SL2, and SL3 may be reduced or minimized. In this case, the first, second, and third preliminary resonant controllers AL1, AL2, and AL3 may be dried during the same time period, and the time period, in which the coffee ring phenomenon (occurring on the upper surfaces of the first, second, and third preliminary resonant controllers AL1, AL2, and AL3) is continued, is a constant (i.e., the same for each of the first, second, and third preliminary resonant controllers AL1, AL2, and AL3). Therefore, the upper surfaces of the first, second, and third resonant controllers RL1, RL2, and RL3 may have substantially the same curvature.

In addition, since the solutes are dissolved in the first, second, and third solutions SL1, SL2, and SL3 in different concentrations, thus the amount (of the solutes) contained in the first, second, and third preliminary resonant controllers AL1, AL2 and AL2 is different from each other. Accordingly, the first, second, and third resonant controllers RL1, RL2, and RL3 may have different thicknesses, in a range from a few nanometer to hundreds of micrometers.

According to the method of forming the first, second, and third resonant controllers RL1, RL2, and RL3 described with reference to FIGS. 5B and 5C, the first, second, and third resonant controllers RL1, RL2, and RL3 having different thicknesses may be easily formed using the first, second, and third preliminary resonant controllers AL1, AL2, and AL3 having the same thickness. Thus, the time period required to dry the first, second, and third preliminary resonant controllers AL1, AL2, and AL3 may be set to be a constant. As a result, one or more of the first, second, or third preliminary resonant controllers AL1, AL2, and AL3 may be reduced or prevented from being over-etched, which happens when the first, second, and third preliminary resonant controllers AL1, AL2, and AL3 are dried during different time periods, and thus the flatness of the upper surfaces may be prevented from being partially deteriorated compared to that of the others. Consequently, since the flatness of the first, second, and third resonant controller RL1, RL2, and RL3 may be easily maximized (or increased) by controlling the time period required to perform the drying process, and the first, second, and third resonant controllers RL1, RL2, and RL3 may be dried during the same time period, the flatness of the upper surfaces may be uniform.

Figure 5D:
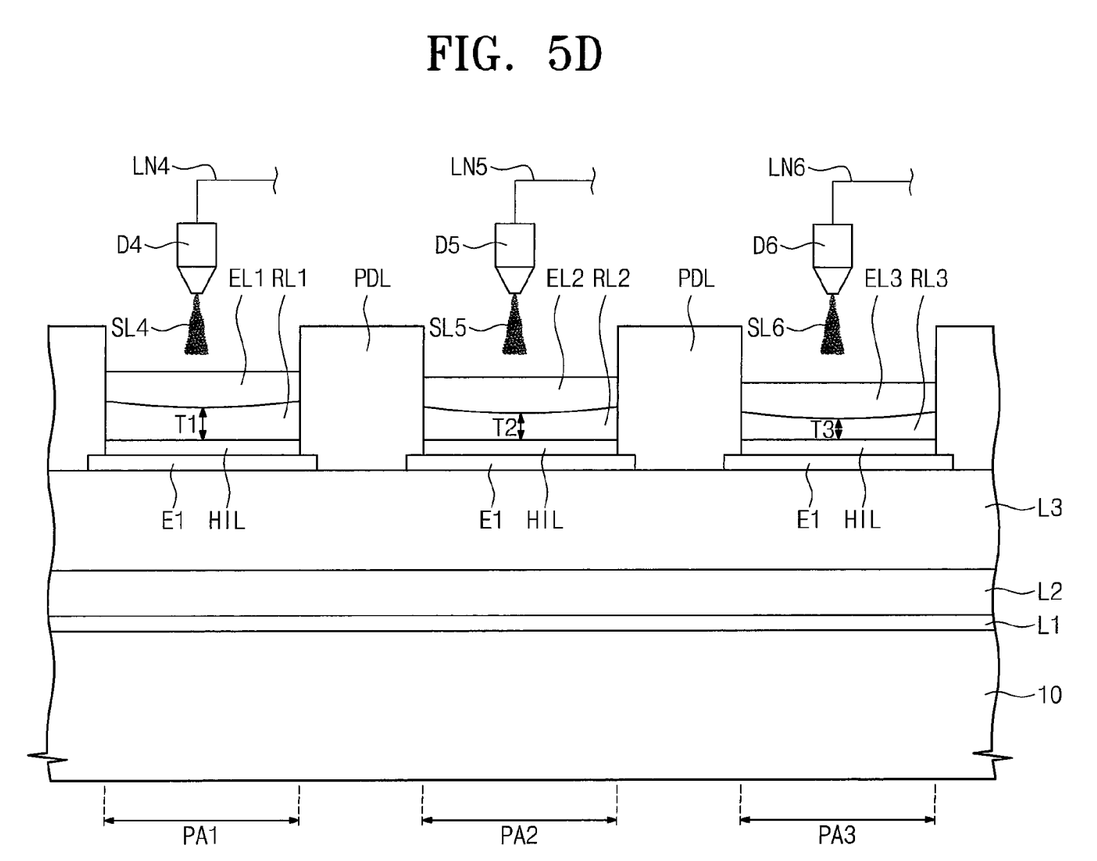

Referring to FIGS. 4 and 5D, the first organic light emitting layer EL1 is formed on the first resonant controller RL1, the second organic light emitting layer EL2 is formed on the second resonant controller RL2, and the third organic light emitting layer EL3 is formed on the third resonant controller RL3.

The first, second, and third organic light emitting layers EL1, EL2, and EL3 are formed by the following method. The fourth spray unit D4, the fifth spray unit D5, and the sixth spray unit D6 are prepared. The fourth spray unit D4 is connected to the fourth tank ST4 through the fourth line LN4, the fifth spray unit D5 is connected to the fifth tank ST5 through the fifth line LN5, and the sixth spray unit D6 is connected to the sixth tank ST6 through the sixth line LN6.

The fourth spray unit D4 sprays the fourth solution SL4 to the first pixel area PA1 to form the first organic light emitting layer EL1, the fifth spray unit D5 sprays the fifth solution SL5 to the second pixel area PA2 to form the second organic light emitting layer EL2, and the sixth spray unit D6 sprays the sixth solution SL6 to the third pixel area PA3 to form the third organic light emitting layer EL3.

Figure 5E:
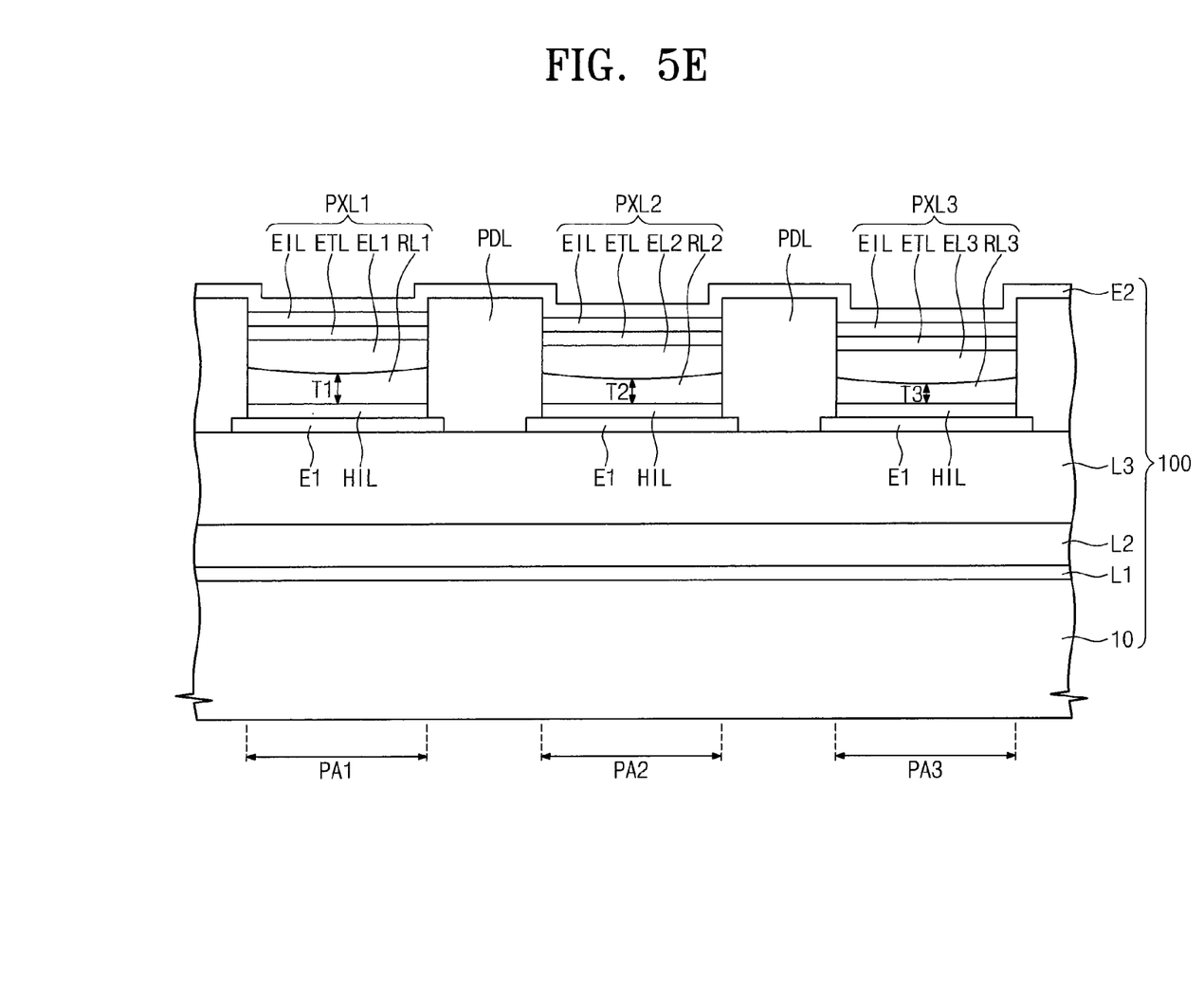

Referring to FIG. 5E, the electron transport layer ETL and the electron injection layer EIL are formed on each of the first, second, and third organic light emitting layers EL1, EL2, and EL3 to form the first, second, and third pixels PXL1, PXL2, and PXL3. Then, when the second electrode E2 is formed to cover the electron injection layer EIL and the pixel definition layer PDL, the display substrate 100 is manufactured. The sealing part 150 is formed on the display substrate 100 to seal the display substrate 100.

Although the example embodiments of the present invention have been described, it is understood that the present invention should not be limited to these example embodiments but various changes and modifications can be made by one of ordinary skill in the art within the spirit and scope of the present invention as hereinafter claimed, and equivalents thereof.

What is claimed is:

1. A method of manufacturing an organic electroluminescent display, the method comprising:
preparing a substrate having a plurality of pixel areas defined thereon, the pixel areas comprising a first group of pixel areas for a first color of pixels, and at least a second group of pixel areas for at least a second color of pixels;
forming a plurality of first electrodes in the pixel areas;
forming a plurality of organic light emitting layers on the first electrodes;
forming a plurality of resonant controllers on the first electrodes by:
providing a first solution of a first solute in a first solvent at a first concentration;
providing at least a second solution of a second solute in a second solvent at a second concentration;
respectively applying the first and second solutions to the first and second groups of pixel areas, and
removing the first and second solvents from the first and second solutions, thereby forming a plurality of resonant controllers, wherein the resonant controllers produced from the first solution have different thicknesses than the resonant controllers produced from the second solution, wherein the first and second solutes include a same material, the first and second solvents include a same material, and an amount of the first solute is different from an amount of the second solute; and
forming a second electrode on the organic light emitting layers.

2. The method of claim 1, wherein the removing the first and second solvents from the solutions comprises drying the first and second solutions during a same time period.

3. The method of claim 2, wherein a plurality of preliminary resonant controllers are formed by the respectively applying a same amount of the first and second solutions to the first and second groups of pixel areas, and each of the plurality of preliminary resonant controllers has a same thickness.

4. The method of claim 3, wherein an amount of the first and second solvents removed from the first and second solutions is different from each other in accordance with the concentration of each of the first and second solutions.

5. The method of claim 1, wherein the forming of the plurality of organic light emitting layers comprises:
forming a first organic light emitting layer in the first group of pixel areas;
forming a second organic light emitting layer in the second group of pixel areas, the second organic light emitting layer configured to emit light having a color different from the first organic light emitting layer; and
forming a third organic light emitting layer in a third group of pixel areas for a third color of pixels, the third organic light emitting layer configured to emit light having a color different from the first and second organic light emitting layers,
wherein the forming of the plurality of resonant controllers comprises:
forming a first resonant controller in the first group of pixel areas to overlap with the first organic light emitting layer;
forming a second resonant controller in the second group of pixel areas to overlap with the second organic light emitting layer and to have a thickness different from a thickness of the first resonant controller; and
forming a third resonant controller in the third group of pixel areas to overlap with the third organic light emitting layer and to have a thickness different from the thickness of the first resonant controller and the thickness of the second resonant controller.

6. The method of claim 5, wherein the forming of the first, second and third resonant controllers comprises:
providing the first solution, the second solution, and a third solution on the corresponding first, second and third organic light emitting layers at a corresponding first, second and third concentration to form a corresponding first, second and third preliminary resonant controller; and
drying the first, second and third preliminary resonant controller.

7. The method of claim 6, wherein the first, second, and third preliminary resonant controllers are dried during a same time period.

8. The method of claim 6, wherein the third solution comprises a third solute and a third solvent, and an amount of the first solute, the second solute, and the third solute is different from each other.

9. The method of claim 6, wherein the first solution is provided to the first group of pixel areas through a first spray unit, the second solution is provided to the second group of pixel areas through a second spray unit, and the third solution is provided to the third group of pixel areas through a third spray unit.

10. The method of claim 9, wherein the first spray unit receives the first solution from a first tank containing the first solution, the second spray unit receives the second solution from a second tank containing the second solution, and the third spray unit receives the third solution from a third tank containing the third solution.

11. The method of claim 6, wherein the first organic light emitting layer emits a red light, the second organic light emitting layer emits a green light, and the third organic light emitting layer emits a blue light.

12. The method of claim 5, wherein a wavelength of the light emitted from the first organic light emitting layer is the greatest among the first, second, and third organic light emitting layers, a wavelength of the light emitted from the third organic light emitting layer is the smallest among the first, second, and third organic light emitting layers, the thickness of the first resonant controller is the greatest among the first, second, and third resonant controllers, and the thickness of the third resonant controller is the smallest among the first, second, and third resonant controllers.

13. The method of claim 1, further comprising:
  forming a hole injection layer on each of the plurality of first electrodes before the organic light emitting layers are formed;
    forming a hole transport layer on the hole injection layer before the organic light emitting layers are formed;
    forming an electron transport layer on each of the plurality of organic light emitting layers before the second electrode is formed; and
    forming an electron injection layer on the electron transport layer before the second electrode is formed,
      wherein the forming of the hole injection layer on each of the plurality of first electrodes is before the organic light emitting layers are formed.

14. The method of claim 13, wherein the hole injection layer, the hole transport layer, the electron transport layer, or the electron injection layer is formed as the resonant controllers.

15. The method of claim 13, wherein the resonant controllers are formed between the first electrodes and the organic light emitting layers.

16. The method of claim 13, wherein the resonant controllers are formed between the second electrode and the organic light emitting layers.

17. A method of manufacturing an organic electroluminescent display, the method comprising:
  preparing a substrate having a plurality of pixel areas defined thereon, the pixel areas comprising a first group of pixel areas for a first color of pixels, and at least a second group of pixel areas for at least a second color of pixels;
  forming a plurality of first electrodes in the pixel areas;
  forming a plurality of organic light emitting layers on the first electrodes;
  forming a plurality of resonant controllers on the first electrodes by:
    providing a first solution of a resonant source material in a solvent at a first concentration;
    providing at least a second solution of the resonant source material in the solvent at a second concentration different from the first concentration;
    respectively applying the first and second solutions to the first and second groups of pixel areas, and
    removing the solvent from the first and second solutions during a same time period, thereby forming a plurality of resonant controllers, wherein first resonant controllers produced from the first solution have different thicknesses than second resonant controllers produced from the second solution, and upper surfaces of the first resonant controllers have substantially a same curvature with upper surfaces of the second resonant controllers; and
  forming a second electrode on the organic light emitting layers.

* * * * *